(12) United States Patent
Mozes et al.

(10) Patent No.: US 6,615,396 B1
(45) Date of Patent: Sep. 2, 2003

(54) SEARCHING FOR A PATH THROUGH A CIRCUIT

(75) Inventors: Oz Mozes, deceased, late of Haifa (IL); by Dan Mozes, legal representative, Rehovot (IL); by Edna Mozes, legal representative, Rehovot (IL)

(73) Assignee: Intel Corporation, Santa Clara, CA (US)

( * ) Notice: Subject to any disclaimer, the term of this patent is extended or adjusted under 35 U.S.C. 154(b) by 371 days.

(21) Appl. No.: 09/648,090

(22) Filed: Aug. 25, 2000

(51) Int. Cl.[7] .............................................. G06F 17/50
(52) U.S. Cl. ................................ 716/6; 716/18; 703/19
(58) Field of Search ....................... 716/1–6, 18; 703/19

(56) References Cited

U.S. PATENT DOCUMENTS

| | | | |
|---|---|---|---|
| 5,210,700 A | * 5/1993 | Tom ............................... | 716/6 |
| 5,355,321 A | * 10/1994 | Grodstein et al. .............. | 716/6 |
| 5,572,437 A | * 11/1996 | Rostoker et al. ............... | 716/18 |
| 5,572,717 A | * 11/1996 | Pedersen ........................ | 713/500 |
| 5,657,239 A | * 8/1997 | Grodstein et al. .............. | 716/6 |
| 5,740,347 A | * 4/1998 | Avidan ........................... | 714/33 |
| 5,825,658 A | * 10/1998 | Ginetti et al. .................. | 716/6 |
| 5,923,564 A | * 7/1999 | Jones, Jr. ........................ | 716/6 |
| 6,023,568 A | * 2/2000 | Segal ............................. | 716/6 |

OTHER PUBLICATIONS

Benkoski et al., "The Role of Timing Verification in Layout Synthesis" http://www.sigda.acm.org/Archives/Proceeding/Archives/Dac/Dac91/papers/199 . . . /37_1.ht, Jun. 13, 2000.

* cited by examiner

Primary Examiner—Matthew Smith
Assistant Examiner—Paul Dinh
(74) Attorney, Agent, or Firm—Fish & Richardson P.C.

(57) ABSTRACT

Searching for a target path in a sequential circuit having plural paths includes (i) locating-a reference point on the circuit from which circuit timing requirements are defined, and (ii) propagating timing information back through the plural paths from the reference point. The target path is identified from among the plural paths based on the timing information.

27 Claims, 3 Drawing Sheets

SEARCHING FOR A PATH THROUGH A CIRCUIT

TECHNICAL FIELD

This invention relates to searching for a target path in a circuit having plural paths and to performing a timing analysis on the circuit.

BACKGROUND

In order to operate properly, circuits must meet pre-specified timing requirements. A signal may arrive at its destination through multiple paths. A timing analyses is therefore performed during the circuit design process in order to ensure that signals propagating through the circuit paths arrive at their destinations at the proper time.

DETAILED DESCRIPTION

Figure 1:
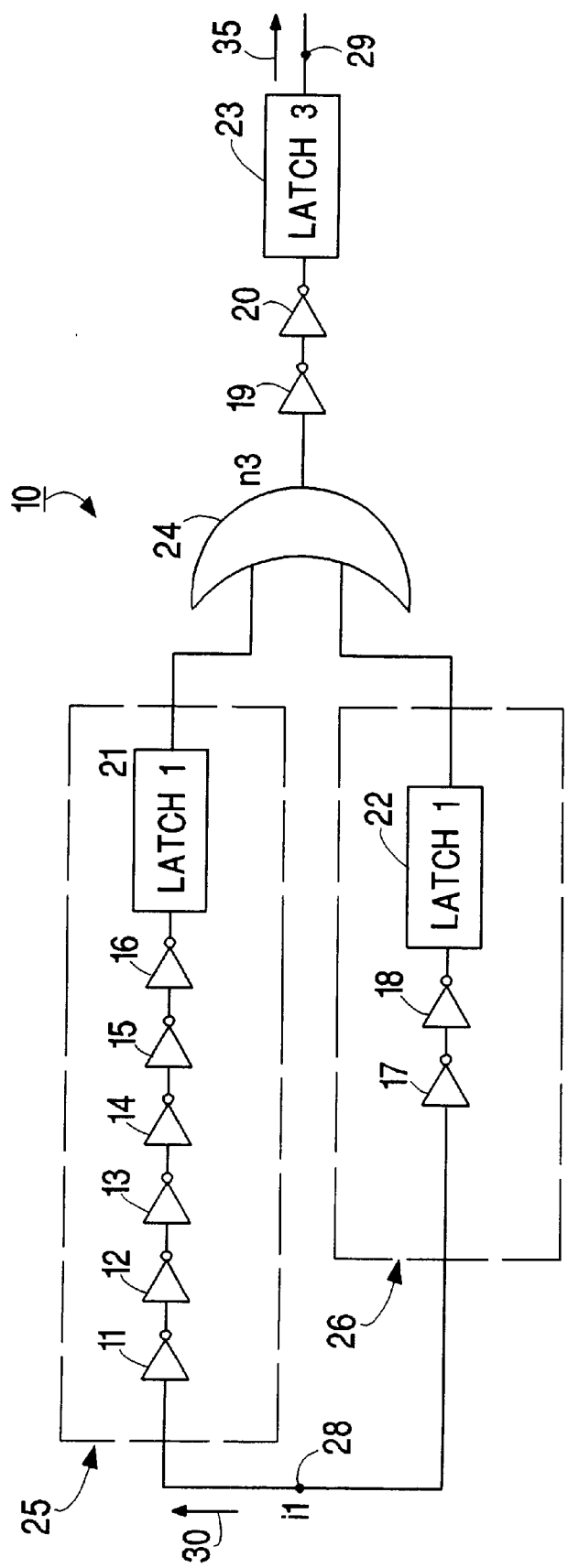
FIG. 1 is a block diagram of a circuit.

FIG. 1 shows a circuit 10. Circuit 10 is a sequential circuit containing inverters 11 to 20, latches 21 to 23, and gate 24. Other circuit elements (not shown) may be included in circuit 10 in addition to, or instead of, those shown. Circuit 10 contains paths 25 and 26, through which signal "i1" propagates to gate 24 (n3). At gate 24, the signals from paths 25 and 26 are combined and output through inverters 19, 20 and latch 23. The identity of the signals and the specific function of circuit 10 is not important for the purposes of the processes described below.

During the design phase, circuit 10 is modeled using computer software. A timing analysis is performed on circuit 10 using a representation of circuit 10 generated with the software. This timing analysis is used to determine the "worst case" delay through the paths of circuit 10. That is, in order for circuit 10 to operate properly, the signal arriving at latch 23 through paths 25 and 26 should arrive no later than a predetermined time. The different paths of circuit 10 therefore must be analyzed in order to determine if any of these paths violate this timing condition. Typically, this analysis is performed for hundreds or thousands of paths, depending upon the size and complexity of the circuit. However, for illustration, the analysis is performed only for the two paths 25 and 26 of circuit 10.

Figure 2:
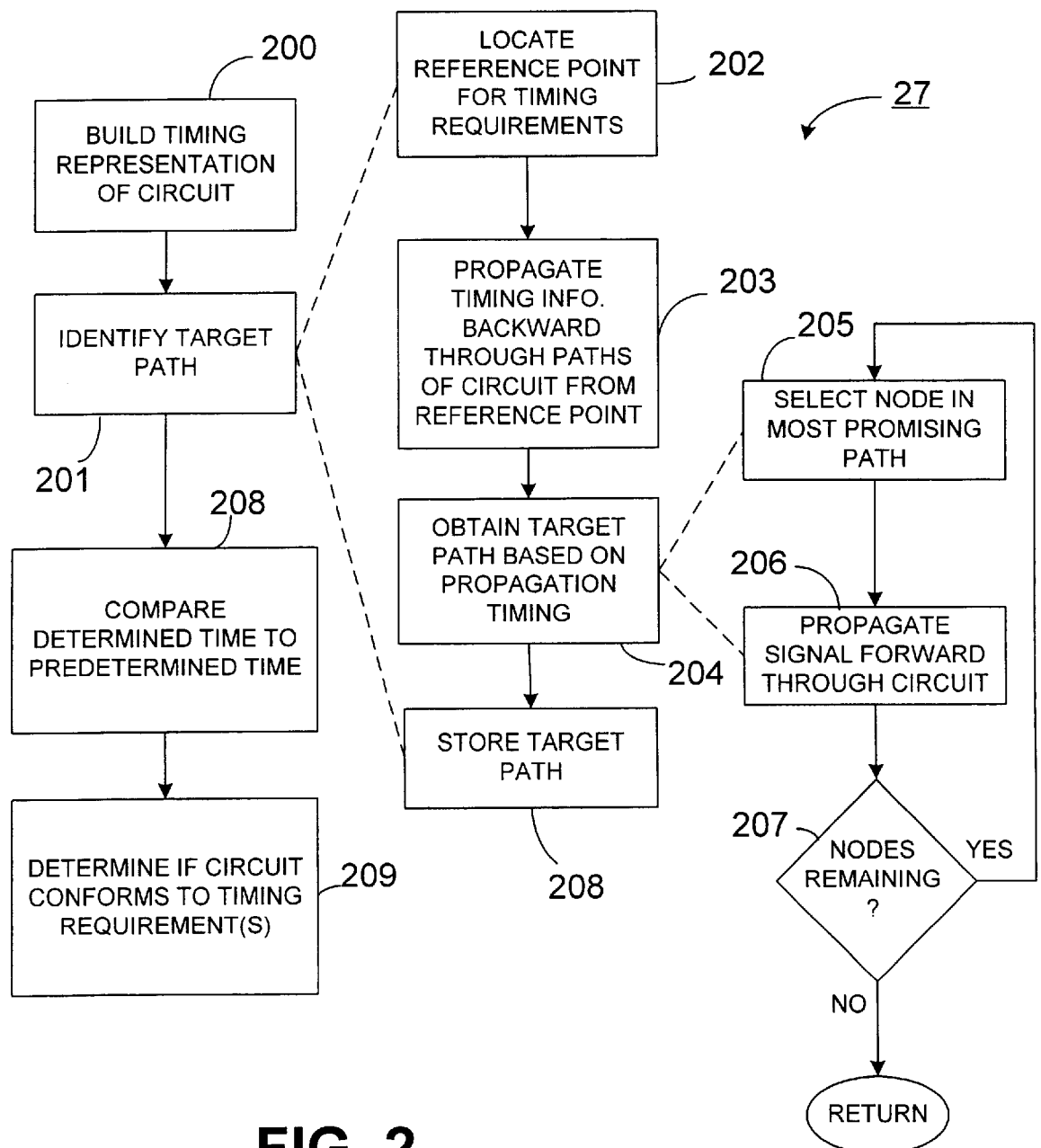
FIG. 2 is a flowchart showing a process for performing a timing analysis on the circuit of FIG. 1.

FIG. 2 shows a process 27 for performing the above-described timing analysis on a computer representation of circuit 10. Process 27 is related to the Esperance process for analyzing timing of combinatorial logic circuits in that both processes are used to find the "worst case" delay through paths in a circuit. Process 27, however, can be performed on sequential circuits, combinatorial logic circuits, and combinations thereof. In this context, "sequential" circuits include clocked latches, flip-flops, and domino cells, in addition to combinational logic elements.

Process 27 analyzes the circuit path with the largest delay first (called the "most critical path"). As a result, the remaining paths need not be analyzed, decreasing the complexity of the timing analysis.

Process 27 builds (200) a timing representation of circuit 10. The timing representation may include a netlist that defines the interconnection and timing characteristics of the various elements that make up circuit 10. A "timing characteristic" of a circuit element includes the time that it takes for a signal to propagate through that circuit element.

Process 27 identifies (201) a target path from among paths 25 and 26. The target path is the path through which it takes the longest amount of time for a signal to propagate. The target path is thus the "most critical path" for circuit 10. Process 27 identifies the target path by locating (202) a reference point 29 on circuit 10 from which the circuit's timing requirements are defined. This may be done by examining the computer representation of circuit 10. As shown, point 29 is selected as the reference point, although an alternative reference point may be used.

Process 27 propagates (203) timing information backward through circuit paths 25 and 26 from reference point 29. Process 27 marks each circuit element with an indication of the amount of timing delay produced by that circuit element. The delay is indicated by the timing characteristics of the circuit elements in the netlist that defines circuit 10.

By way of example, assume that the timing requirements of circuit 10 specify that a signal 35 (represented by an arrow in FIG. 1) must be valid at time "15". Also assume that the time it takes for a signal to propagate through each element of circuit 10 is "1" (e.g., nanosecond). Each element in circuit 10 is assigned times based on the time that signal 35 must be valid and the time that it takes for the signal to propagate through each of the circuit elements. It is noted that the times assigned in process 27 may not correspond to the actual time that it takes for signals to propagate along a path. These times are used merely as references in order to determine which path is the most critical and then to perform an actual timing analysis on that path.

Counting the number of circuit elements through parallel path 25 and latch 23, there are eleven elements, including inverters 11 to 16, latch 21, gate 24, inverters 19 and 20, and latch 23. Counting the number of circuit elements through parallel path 26 and latch 23, there are seven elements, including inverters 17 and 18, latch 22, gate 24, inverters 19 and 20, and latch 23. Times are assigned to each circuit element that indicate when a signal must be valid at that circuit element in order to ensure that signal 35 is valid at time "15". So, for example, signal 30 must be valid at time "4" in order for signal 35 to be valid at time "15". The value "4" is determined by subtracting from the time "15" the sum of the times associated with the intervening circuit elements, of which there are eleven (15−11=4). Inverter 11 is therefore assigned the value "4". Signal 30 must be valid at time "8" in order for signal 35 to be valid at time "15". The value "8" is determined by subtracting from the time "15" the sum of the times associated with the intervening circuit elements, of which there are seven (15−7=8). Inverter 17 is therefore assigned the value "8". Other signal validity times may also be determined in this manner for the remaining elements of circuit 10. The foregoing process will, of course, change in cases where the propagation time through each circuit element is different from the value "1".

Process 27 obtains (204) the target path (i.e., the "most critical path") based on the times assigned to the circuit elements. More specifically, process 27 selects (205) a circuit element or "node", relative to a second reference point such as point 28, which is in a path that is most likely to be the target path. In circuit 10, process 27 selects (205), as the target path, the path that includes the circuit element with the lowest assigned time. The reasoning behind selecting the path having the circuit element with the lowest assigned time is that the first circuit element along a path with a highest potential delay (i.e., the most critical path) will have the lowest assigned time.

Following through on the foregoing example, path 25 has elements which, when combined, produce a greater delay than the circuit elements of path 26. Thus, the first circuit element 11 in path 25 has a lower assigned time than the first circuit element 17 in path 26. In this example, therefore, process 27 selects path 25 as the target path.

The other paths, in this case path 26, are ignored or "pruned" in subsequent analyses. These paths are ignored because they have less delay (e.g., they have circuit elements with a smaller overall delay) and, thus, are less likely to adversely affect circuit timing. Even though there are fewer circuit elements in path 26 if those circuit elements, when combined, produce a greater delay than the circuit elements of path 25, the first circuit element on path 26 (i.e., element 17) relative to point 28 would be selected in 205.

Once the circuit element has been selected (205), process 27 propagates a signal forward (206) through that circuit element. This continues (207) until the signal has propagated through all circuit elements (i.e., nodes) on the target path. The location of the target path is then stored (208) in a memory, along with the time it took for the signal to propagate through the target path.

Process 27 compares (208) the amount of time it took for the signal to propagate through the target path to the maximum amount of time that a signal can take to propagate through circuit 10 and still meet that circuit's timing requirements. Based on this comparison, process 27 determines (209) whether the design of circuit 10 meets those timing requirements. That is, if the target path meets the timing requirements, then all paths parallel to the target path, i.e., "non-critical" paths with fewer circuit elements, will also meet the timing requirements. This is because, by definition, it takes less time for a signal to propagate through the other paths than through the target path.

Thus, in the foregoing example, process 27 compares the time that it takes for signal 30 to propagate through path 25 and latch 23 to the maximum amount of time permissible, i.e., "15" in this case. If the measured time is less than the maximum time, then circuit 10 meets the predetermined timing requirements. If the measured time is greater than the maximum time, circuit 10 does not meet the predetermined timing requirements. In this case, circuit 10 may be redesigned and a new simulation executed in accordance with process 27 to determine if the redesigned circuit meets the timing requirements.

Figure 3:
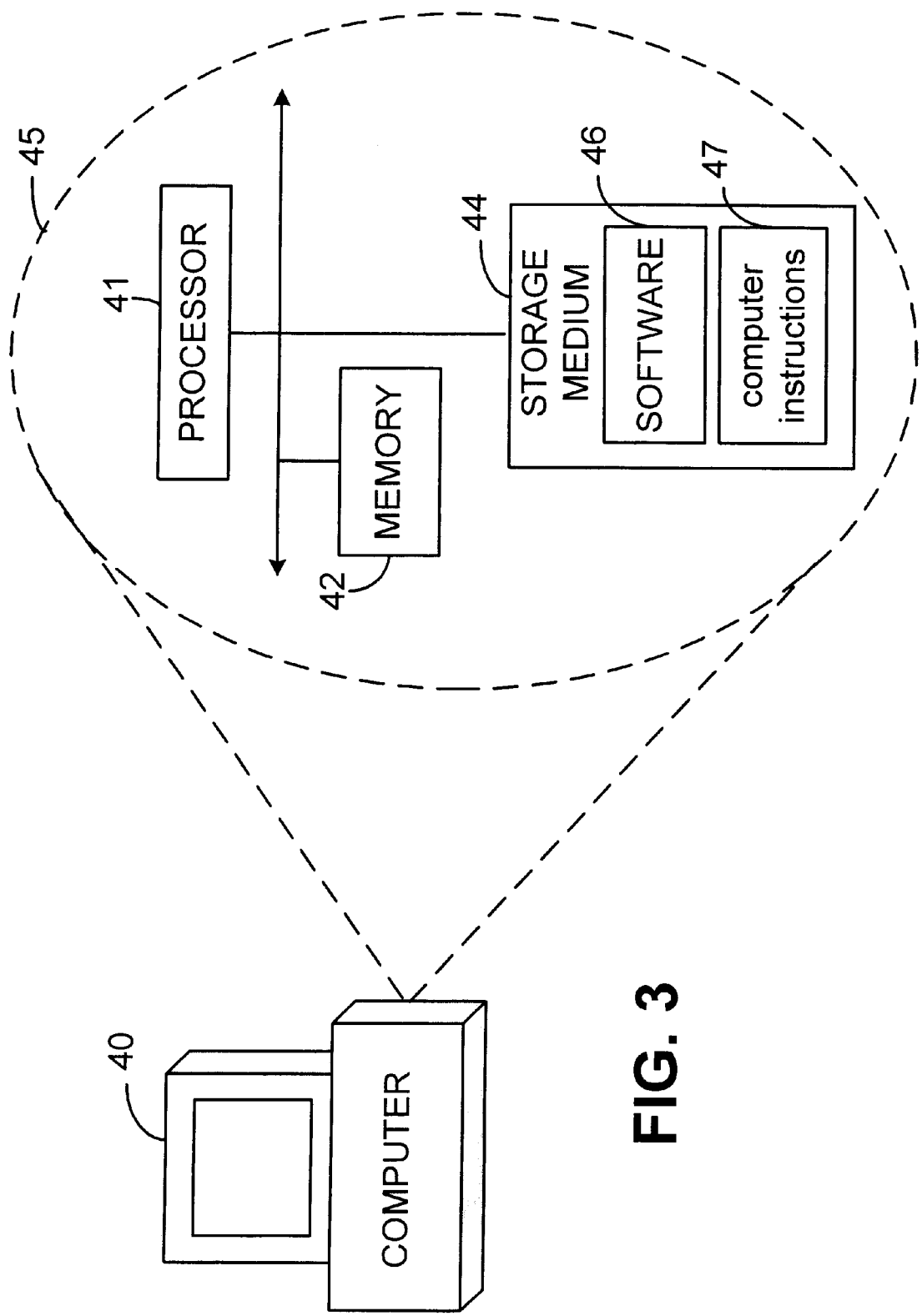
FIG. 3 is a block diagram of a computer system that performs the process of FIG. 2.

FIG. 3 shows a computer 40 for generating a simulation of circuit 10 using computer software and for performing timing analyses in accordance with process 27. Computer 40 includes a processor 41, a memory 42, and a storage medium 44, e.g., a hard disk (see view 45). Storage medium 44 stores software 46 for generating a representation circuit 10 and computer-executable instructions 47 for performing process 27. Processor 44 executes software 46 and computer-executable instructions 47 out of memory 42.

Although a personal computer is shown in FIG. 3, process 27 is not limited to use with any particular hardware or software configuration; it may find applicability in any computing or processing environment. Process 27 may be implemented in hardware, software, or a combination of the two. For example, process 27 may be implemented using logic gates such as NAND and NOR gates, programmable logic such as a field programmable gate array (FPGA), and/or application-specific integrated circuits (ASICs).

Process 27 may be implemented in one or more computer programs executing on programmable computers that each include a processor, a storage medium readable by the processor (including volatile and non-volatile memory and/or storage elements), at least one input device, and one or more output devices. Program code may be applied to data entered using an input device to perform process 27 and to generate output information. The output information may be applied to one or more output devices.

Each such program may be implemented in a high level procedural or object-oriented programming language to communicate with a computer system. However, the programs can be implemented in assembly or machine language. The language may be a compiled or an interpreted language.

Each computer program may be stored on a storage medium or device (e.g., CD-ROM, hard disk, or magnetic diskette) that is readable by a general or special purpose programmable computer for configuring and operating the computer when the storage medium or device is read by the computer to perform process 27. Process 27 may also be implemented as a computer-readable storage medium, configured with a computer program, where, upon execution, instructions in the computer program cause the computer to operate in accordance with process 27.

Other embodiments not described herein are also within the scope of the following claims. For example, process 27 may be applied to small-scale circuitry or to VLSI (Very Large Scale Integrated) circuits. Process 27 may be applied to combinatorial logic circuits, as well as sequential circuitry, or to combinations of combinatorial and sequential circuitry. Process 27 may be applied to strings of circuit paths and to multiple, e.g., more than two, circuit paths. Process 27 may also be used with any sort of circuit simulation program that is capable of performing timing analyses. Process 27 can be used to perform a timing analysis on any circuit having plural paths regardless of the circuit's function.

What is claimed is:

1. A method of searching for a target path in a sequential circuit having plural paths, comprising:

locating a reference point on the-circuit from which circuit timing requirements are defined;

propagating timing information back through the plural paths from the reference point, the timing information comprising times at which a signal must be present at a first circuit element in order to satisfy a timing constraint of the sequential circuit;

identifying the target path from among the plural paths based on the timing information, the target path being a path having a second circuit element with a lowest time at which the single must be present; and performing an analysis only with respect to the target path.

2. The method of claim 1, further comprising: selecting the target a path from among the plural paths, the target path having a longest delay among the plural paths.

3. The method of claim 1, wherein the times correspond to propagation of signals through circuit elements along the plural paths.

4. The method of claim 1, wherein the analysis comprises:

determining an amount of time that it takes for a signal to propagate along the target path;

comparing the amount of time to a predetermined time; and determining whether the circuit conforms to the timing constraint based on the comparing.

5. A method of analyzing timing in a sequential circuit having plural paths, comprising:

identifying a target path from among the plural paths, the target path having a propagation time that is greater than propagation times of others of the plural paths, identifying being performed by identifying a path having a circuit element with a lowest time at which a signal propagated through the path must be present; and determining an amount of time that it takes for a signal to propagate only along the target path.

6. The method of claim 5, further comprising:

comparing the amount of time to a predetermined time; and determining whether the circuit conforms to a predetermined timing requirement based on the comparing.

7. The method of claim 5, wherein identifying the target path comprises:

examining times for circuit elements on the circuit; and selecting, as the target path, the path with the lowest time for a circuit element.

8. The method of claim 5, wherein the circuit comprises a simulated sequential circuit having one or more latches.

9. An article comprising a computer-readable medium which stores executable instructions for searching for a target path in a sequential circuit having plural paths, the instructions causing a computer to:

locate a reference point on the circuit from which circuit timing requirements are defined;

propagate timing information back through the plural paths from the reference point, the timing information comprising times at which a signal must be present at a first circuit element in order to satisfy a timing constraint of the sequential circuit;

identify the target path from among the plural paths based on the timing information, the target path being a path having a second circut element with a lowest time at which the single must be present; and perform an analysis only with respect to the target path.

10. The article of claim 9, wherein the times correspond to propagation of signals through circuit elements along the plural paths.

11. The article of claim 9, wherein the analysis is performed by instructions that cause the computer to:

determine an amount of time that it takes for a signal to propagate along the target path;

compare the amount of time to a predetermined time; and determine whether the circuit conforms to the timing constraint based on the comparing.

12. The computer program of claim 9, wherein the target path comprises a path that has a longest delay among the plural paths.

13. An article comprising a computer-readable medium which stores executable instructions for analyzing timing in a sequential circuit having plural paths, the instructions causing a computer to:

identify a target path from among the plural paths, the target path having a propagation time that is greater than propagation times of others of the plural paths, identifying being performed by identifying a path having a circuit element with a lowest time at which a signal propagated through the path must be present; and determine an amount of time that it takes for a signal to propagate only along the target path.

14. The article of claim 13, further comprising instructions that cause the computer to:

compare the amount of time to a predetermined time; and determine whether the circuit conforms to a predetermined timing requirement based on the comparing.

15. The article of claim 13, wherein identifying the target path comprises:

examining times for circuit elements on the circuit; and selecting as target path the path with the lowest time for a circuit element.

16. The article of claim 13, wherein the circuit comprises a simulated sequential circuit having one or more latches.

selecting, as the target path, the path with the lowest time for a circuit element.

17. An apparatus for searching for a target path in a sequential circuit having plural paths, the apparatus comprising circuitry which:

locates a reference point on the circuit from which circuit timing requirements are defined;

propagates timing information back through the plural paths from the reference point, the timing information comprising times at which a signal must be present at a first circuit element in order to satisfy a timing constraint of the sequential circuit; and identifies the target path from among the plural paths based on the timing information, the target path being a path having a second circuit element with a lowest time at which the signal must be present; and perform an analysis only with respect to the target path.

18. The apparatus of claim 17, wherein the times correspond to propagation of signals through circuit elements along the plural paths.

19. The apparatus of claim 17, wherein the circuitry;

determines an amount of time that it takes for a signal to propagate along the target path;

compares the amount of time to a predetermined time; and determines whether the circuit conforms to the timing constraint based on the comparing.

20. The apparatus of claim 17, wherein the circuitry comprises a processor and a memory.

21. The apparatus of claim 17, wherein the circuitry comprises one or more of logic gates and programmable logic.

22. An apparatus for analyzing timing in a sequential circuit having plural paths, the apparatus comprising circuitry which:

identifies a target path from among the plural paths, the target path having a propagation time that is greater than propagation times of others of the plural paths, identifying being, performed by identifying a path having a circuit element with a lowest time at which a signal propagated through the path must be present; and determines an amount of time that it takes for a signal to propagate only along the target path.

23. The apparatus of claim 22, wherein the circuitry:

compares the amount of time to a predetermined time; and determines whether the circuit conforms to a predetermined timing requirement based on the comparing.

24. The apparatus of claim 22, wherein identifying the target path comprises:

examining times for circuit elements on the circuit; and selecting, as the target path, the path with the lowest time for a circuit element.

25. The apparatus of claim 22, wherein the circuit comprises a simulated sequential circuit having one or more latches.

26. The apparatus of claim 22, wherein the circuitry comprises a processor and a memory.

27. The apparatus of claim 22, wherein the circuitry comprises one or more of logic gates and programmable logic.

\* \* \* \* \*